Figure 1:
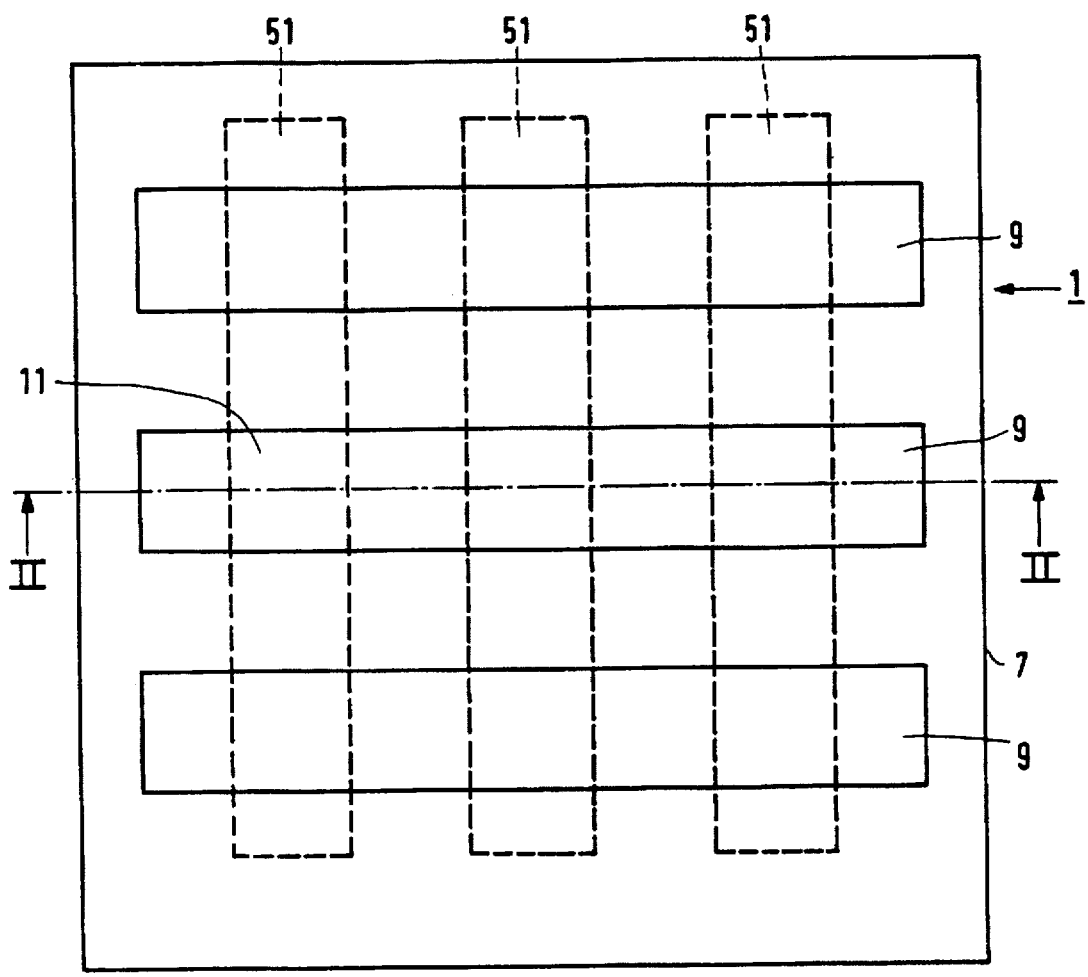

United States Patent [19]
Staring et al.

[11] Patent Number: 5,705,888
[45] Date of Patent: Jan. 6, 1998

[54] ELECTROLUMINESCENT DEVICE COMPRISING A TRANSPARENT STRUCTURED ELECTRODE LAYER MADE FROM A CONDUCTIVE POLYMER

[75] Inventors: Aemilianus G. J. Staring; David B. Braun, both of Eindhoven, Netherlands

[73] Assignee: U.S. Philips Corporation, New York, N.Y.

[21] Appl. No.: 523,837

[22] Filed: Sep. 6, 1995

[30] Foreign Application Priority Data

Sep. 6, 1994 [EP] European Pat. Off. ............ 94202543

[51] Int. Cl.$^6$ ............................ H05B 33/02; H01L 33/00
[52] U.S. Cl. ............................. 313/503; 313/504; 313/505
[58] Field of Search .......................... 313/498, 503, 313/504, 505

[56] References Cited

U.S. PATENT DOCUMENTS 5,300,858  4/1994  Nikuido .......................... 313/503

FOREIGN PATENT DOCUMENTS 615257  9/1996  European Pat. Off. .
216023  9/1992  WIPO .

OTHER PUBLICATIONS

J. C. Gustafsson et al, "In situ spectroscopic investigations of electrochromism and ion transport in a poly (3,4-ethylanedioxythiophane) electrode in a solid state electrochemical cell", Solid State Ionics, 1994, pp. 145–152.

Y. Cao et al, "Influence of chemical polymerization conditions on the properties of polyaniline", Polymer, 1989, vol. 30, Dec., pp. 2350–2311.

G. Gustafsson et al, "Flexible Light-emitting diodes made from soluble conducting polymers", Nature, vol. 357, 11 Jun. 1992, pp. 477–479.

D. Braus, et al, "Photo and electroluminescence efficiency in poly(dialkoxy-p-phenylenevinylene)", Synthetic Metals, 1994, pp. 75–79.

E. Staring et al, "Photo and Elecroluminescence Efficiency in Soluble Poly(dialkyl-p-phenylenevinylene)", Adanced Materials, 1994, 6 No. 12, pp. 934–937.

Primary Examiner—Nimeshkumar Patel
Attorney, Agent, or Firm—Norman N. Spain

[57] ABSTRACT

An electroluminescent (EL) device is (1) composed of polymeric LEDs comprising an active layer (7) of a conjugated polymer and a transparent polymeric electrode layer (5) having electroconductive areas (51) as electrodes. Like the active layer (7), the electrode layer (5) can be manufactured in a simple manner by spin coating. The electrode layer (5) is structured into conductive electrodes (51) by exposure to UV light. The electrodes (9) and (51) jointly form a matrix of LEDs for a display. When a flexible substrate (3) is used, a very bendable EL device is obtained.

9 Claims, 2 Drawing Sheets

ELECTROLUMINESCENT DEVICE COMPRISING A TRANSPARENT STRUCTURED ELECTRODE LAYER MADE FROM A CONDUCTIVE POLYMER

The invention relates to an electroluminescent device comprising an active layer made from a semiconductive conjugated polymer, which layer is situated between a first and a second electrode layer of which at least the first electrode layer is transparent to the light to be emitted and comprises an electroconductive polymer which is suitable for injecting holes into the active layer. The invention further relates to a method of manufacturing an electroluminescent (EL) device, while using such a conjugated polymer.

The active layer and the two electrode layers jointly constitute a light-emitting diode (LED). The electroluminescent device comprises one LED, but may alternatively comprise more LEDs, for example in the form of a matrix of light-emitting surfaces, such as intended for a display.

Solid-state LEDs are currently frequently used as an illumination source and, for example, in displays and indicator lamps. For the active or emissive layer in EL structures use is often made of traditional III–V semiconductor compounds, such as doped GaAs and GaP. The operation is based on the recombinations of electron-hole pairs which are injected into the semiconductor material from electrodes situated on either side of the active layer. As a result of said recombinations, energy is released in the form of (visible) light; this phenomenon is commonly referred to as electroluminescence. The wavelength and hence the colour of the emitted light are determined by the band gap of the semiconductor material.

When using these inorganic semiconductor materials in combination with the well-known technologies, it is very difficult to manufacture displays having a large surface, for example, of several centimeters. In addition, the available colors of the emitted light are limited to the long-wave portion of the visible spectrum.

By using semiconductive organic polymers, the number of materials which are suitable for use in EL devices is increased. Semiconductive organic polymers have a conjugated polymer chain. The band gap, the electron affinity and the ionization potential can be set by choosing a suitable conjugated polymer chain and suitable side chains. Unlike electroconductive polymers, these conjugated polymers are undoped. An active layer of such a polymeric material can be manufactured by means of a CVD process, using a suitable monomer as the starting material, or by spin coating a solution of a soluble non-conjugated polymeric precursor which is convened to a conjugated polymer by a thermal aftertreatment. Preferably, the active layer is manufactured by spin coating a solution of a soluble conjugated polymer. These processes enable LEDs and displays having a large light-emitting surface to be manufactured in a simple manner. If a polymeric foil is used as a substrate, mechanically flexible LEDs and displays can be manufactured.

The active layer is situated between two electrode layers of electroconductive materials. At least one of said electrode layers must be transparent or translucent to the emitted light in the active layer. One of the electrode layers serves as the (positive) electrode for injecting holes into the active layer. The material of this electrode layer has a high work function and is generally formed by a layer of indium oxide or indiumetin oxide (ITO). In addition, such layers are transparent to the emitted light in the active layer. Particularly ITO is suitable because of its satisfactory electrical conductivity and high transparency. The other electrode layer serves as the (negative) electrode for injecting electrons into the active layer. The material for this layer has a lower work function and is generally formed from a layer of, for example, indium, calcium, barium or magnesium.

The electrode layer of ITO is provided by vacuum evaporation, sputtering or a CVD process. This electrode layer and often also the negative electrode layer, for example, of calcium, are structured in accordance with a pattern by means of a customary photolithographic process or by partly covering it during the vacuum evaporation process with a mask which corresponds to the desired pattern for a display. In a typical example of a display, the electrodes of the first and second electrode layers have line structures which intersect each other at right angles and hence form a matrix of separately drivable rectangular LEDs. The rectangular LEDs constitute the pixels or picture elements of the display. If the electrodes of the first and second electrode layers are connected to a voltage source, light-emitting pixels are formed at the intersections of the electrodes. In this way a display can be formed in a simple manner. Oxides, such as ITO, have the disadvantage, however, that these materials are brittle so that they are less suitable if mechanically flexible LEDs and displays are desired. If the LED is bent through a sharp angle, the oxide breaks and loses its transparency and electrical conductivity at the location of the fracture.

It is known from an article by G. Gustafsson et al., in Nature, Vol. 357, pp. 477–479 (1992) to use in LEDs, the active layer of which is made from a semiconductive conjugated polymer, conductive polyaniline (PANI) instead of ITO as the uniform conductive layer which serves as the hole-injecting electrode. Conductive PANI can easily be spin coated as a film on a substrate. Unlike a metal oxide, conductive PANI is mechanically flexible so that bendable polymeric LEDs and displays can be manufactured. For the electron-injecting electrode use is made of a calcium electrode which is structured in accordance with a pattern which can be obtained by means of a mask during the vacuum evaporation process.

To obtain light-emitting pixels, both electrodes must be structured in accordance with a pattern, for example in the form of lines, and thus form a matrix of separately drivable LEDs for a display. Said article neither suggests structuring of the PANI electrode layer into electrodes nor does it indicate how the PANI layer can be structured into electrodes in accordance with a pattern.

It is an object of the invention to provide, inter alia, a novel electroluminescent device whose transparent electrode layer for injecting holes comprises a polymer and, in addition, is structured into electrodes. The invention further aims at providing a simple method of manufacturing such an electroluminescent device and, more particularly, a structured transparent polymeric electrode layer, said electrode layer being manufactured from a solution, in particular by spin coating.

These objects are achieved by an electroluminescent device as described in the opening paragraph, which is characterized in accordance with the invention in that also patterned areas of an electrically insulating polymer are provided in the transparent (or first) electrode layer. The transparent electrode layer made from a polymer is structured, i.e. it comprises areas having different electrical properties. This means that, dependent on the location, the polymer of the electrode layer is present both in the conductive and non-conductive states. Apart from electroconductive areas, which serve as the real hole-injecting electrodes, the polymeric layer also comprises electrically insulating areas. The expression "electrically insulating" is to be understood to mean herein a surface resistance of at least $10^8$ Ω/square at the layer thicknesses used. At said layer thicknesses, the electroconductive areas have a surface resistance of maximally 1 kΩ/square and hence can suitably be used as electrodes.

Polymers which can suitably be used in the transparent electrode layer are polyaniline (PANI) and poly-3,4-ethylene dioxythiophene (PEDOT). These polymers can be rendered electrically conducting as well as electrically insulating. The manner in which this can be achieved will be indicated hereinbelow.

Suitable conjugated polymers for use in the active or emissive layer are polymers based on poly(3-alkylthiophene) and poly(p-phenylene vinylene). Preferably, soluble conjugated polymers are used because they can be easily applied, for example in a spin-coating process.

Examples of soluble conjugated PPV derivatives are poly(dialkoxy-p-phenylene vinylene) and poly(dialkyl-p-phenylene vinylene). The phenylene groups of these polymers are often substituted with, respectively, alkoxy groups or alkyl groups. Representatives of the first group are, for example, poly[2-methoxy,5-(2-ethylhexyloxy)-p-phenylene vinylene] (MEH-PPV) which emits yellowish-orange light when it is used in the active layer and poly[2-methoxy,5-(3,7-dimethyloctyloxy)-p-phenylene vinylene] which emits orange light. Representatives of the second group are, for example:

poly[2-methyl-5-(n-dodecyl)-p-phenylene vinylene], poly[2-methyl-5-(3,7-dimethyloctyl)-p-phenylenevinylene], and poly[2-methyl-5-(4,6,6-trimethylheptyl)-p-phenylene vinylene].

The last three polymers emit green light when they are used in the active layer. The synthesis of the first group is described in an article by D. Braun et al., Synthetic Metals, Vol. 66 (1), pp. 75–79 (1994) and in the international Patent Application WO 92/16023; the synthesis of the second group is described in an article by A. G. J. Staring et al., Advanced Materials, 1994, 6, 934–937.

Dependent upon the preparation of the conjugated polymer, said polymer may comprise 5 to 10% non-conjugated units. It has been found that such non-conjugated units increase the electroluminescence efficiency, which is defined by the number of photons per injected electron in the active layer.

The above-mentioned conjugated PPV derivatives can be dissolved in the customary organic solvents, for example halogenated hydrocarbons such as chloroform, and aromatic hydrocarbons such as toluene. Acetone and tetrahydrofurane can also be used as solvents.

The degree of polymerization of the conjugated polymer ranges between 10 and 100,000.

The layer thickness of the active layer of the conjugated polymer often ranges between 10 and 250 nm, in particular between 100 and 200 nm.

The LED structure can be provided on a substrate which is made, for example, from glass, quartz glass, ceramic or synthetic resin material. Preferably, use is made of a translucent or transparent substrate. If a flexible electroluminescent device is desired, use is made of a transparent foil of a synthetic resin. Suitable transparent and flexible synthetic resins are, for example, polyimide, polyethylene terephtalate, polycarbonate, polyethene and polyvinyl chloride.

The active layer of a semiconductive conjugated polymer is situated between two electrode layers of electroconductive materials. The first electrode layer is formed by the above-mentioned transparent layer of an electroconductive polymer, such as PANI or PEDOT, and is connected to the positive pole of an external voltage source. The layer thickness of this electrode layer ranges from 100 to 500 nm. This electrode layer serves to inject holes into the active layer. The second electrode layer serves as an electrode for injecting electrons into the active layer and is connected to the negative pole of the external voltage source or to earth. The material for this electrode layer has a low work function and is formed from a layer of, for example, indium, calcium, barium, aluminium or magnesium. The layer thickness of this second electrode layer ranges from 10 to 500 nm. When a thin second electrode layer is used, light emitted by the active layer is transmitted both by this second electrode layer and by the transparent first electrode layer; in this case the LED emits light to two sides. If a thick second electrode layer (a layer thickness of approximately 100 nm and more) is used, the light emitted towards this electrode layer is reflected in the direction of the transparent first electrode layer; in this case the LED emits light to one side. Particularly when reactive barium or calcium is used, it is efficacious to cover this second electrode layer with a protective coating, for example, of an inert metal or epoxy, or both.

For the manufacture of an electroluminescent device in accordance with the invention, both the transparent (first) electrode layer of polyaniline and the active layer of the above-mentioned soluble conjugated polymers are provided from solutions on a suitable substrate. After the solvent has dried, the active layer is provided with a second electrode layer, for example, of calcium, barium, aluminum or magnesium.

To obtain a pattern of electroconductive and insulating areas in the first polymeric electrode layer, the method in accordance with the invention is characterized in that for the manufacture of the first electrode layer use is made of a solution of electroconductive polyaniline and a photochemical radical-forming agent in a solvent, which solution is provided as a layer on the substrate, whereafter said layer is dried and, subsequently, exposed to patterned radiation, thereby forming electrically insulating polyaniline in the exposed areas. The method in accordance with the invention is based on the phenomenon that electroconductive polyaniline becomes substantially insulating when specific radicals are generated in the polyaniline. Said radicals can be generated photochemically. Aliphatic diphenyl ketones, such as 1-benzoyl-1-cyclohexanol, are very effective photochemical radical-forming agents. The ratio between the square resistance of the exposed areas and the unexposed areas is more than $10^7$, as a result of which areas having different electrical properties are formed in the polyaniline layer. In this manner, an electrode structure is formed in the polyaniline layer. Patterned exposure takes place by irradiating with deep UV light (wavelength <320 nm), for example via a mask. In a typical example, conductive PANI has a specific conductivity of 50 S/cm and a square resistance of 1 kΩ/square at a layer thickness of 200 nm. At the same layer thickness, the substantially non-conductive PANI has a square resistance of $10^{10}$ Ω/square.

Another embodiment of the method in accordance with the invention is characterized in that the first electrode layer comprises electroconductive poly-3,4-ethylene dioxythiophene (PEDOT) and in that for the manufacture of this electrode layer a solution of 3,4-ethylene dioxythiophene monomers, an oxidation agent and an organic base in a solvent are used, which solution is provided as a layer on the substrate, after which the layer is exposed to patterned radiation and subsequently heated, thereby forming electrically insulating poly-3,4-ethylene dioxythiophene in the exposed areas.

Solutions comprising monomers as well as oxidation agents typically used for doping, such as Fe(III) salts, are mostly instable. In mixing said components, doped polymers are instantaneously formed in the solution, so that it becomes possible to form a conductive polymer pattern on a substrate. Surprisingly, it has been found that the reaction rate of the polymerization reaction and/or doping reaction can be reduced by adding small quantities of a base to the solution. Dependent upon the concentration of the base, the reaction at room temperature can be suppressed completely. In the case of an efficacious base concentration, solutions comprising monomers and a suitable oxidation agent can be stable for at least 12 hours at room temperature, i.e. polymerization does not take place. These stable solutions can be used to apply thin layers on a substrate, for example, by means of spin coating. After heating of the layer, an electroconductive polymer is formed. If, prior to heating, the spin coated layer of monomers is exposed, for example, to UV light, then, surprisingly, after heating thereof a non-conductive polymer is formed. If the spin coated layer is exposed to patterned radiation, after heating, an electroconductive polymer is formed in the unexposed areas and an insulating polymer (i.e. the square resistance is at least a factor of $10^6$ higher) is formed in the exposed areas.

A solution composed of 3,4-ethylene dioxythiophene (EDOT) monomers, a suitable quantity of a base and an Fe(III) salt as the oxidation agent remains stable at room temperature for at least 12 hours. A layer of this solution can be applied to a substrate by means of spin coating, spraying or dip coating. The layer is exposed to deep UV light ($\lambda<300$ nm) in accordance with a pattern. Subsequently, the layer is heated to approximately 110° C., thereby initiating the polymerization reaction. In the unexposed areas, a conductive polymer having a low square resistance is formed and an insulating polymer is formed in the areas exposed to deep UV light. The layer may then optionally be extracted, for example, with water, methanol or 1-butanol. In this extraction process, the reduced oxidation agent, for example the Fe(II) salt formed, is removed from the layer.

The square resistance obtained and the difference in square resistance between exposed and unexposed areas, which is at least a factor of $10^6$, are sufficient for an electrode structure in the PEDOT layer. In a typical example, conductive PEDOT has a specific conductivity of 300 S/cm and a square resistance of 240 Ω/square at a layer thickness of 140 nm. The substantially non-conductive PEDOT has a square resistance of $0.7 \cdot 10^9$ Ω/square and a specific conductivity of $10^{-4}$ S/cm. Apart from a high conductivity, conductive PEDOT layers exhibit UV-light stability ($\lambda>300$ nm). The temperature stability of PEDOT is many times better than that of other known conductive polymers. At the same layer thickness, PEDOT is more transparent to visible light than PANI.

The ethylene group of PEDOT may be substituted with a $C_1-C_{12}$ alkyl or alkoxy group. These substituents improve the solubility of the EDOT monomers.

Suitable oxidation agents for this method in accordance with the invention are, for example, soluble Fe(III) salts, such as tris(toluene sulphonate) Fe(III), Cu(II) salts, such as $Cu(BF_4)_2$, and Ce(IV) salts. A suitable organic oxidation agent is, for example, 2,3-dichloro-5,6-dicyanoparabenzoquinone (DDQ).

Suitable soluble bases for this method are, for example imidazole, dicyclohexylamine and 1,8-diazabicyclo[5.4.0] undec-7-ene (DBU).

It is possible to use the above-mentioned inorganic substrates as the substrate, but preferably use is made of transparent flexible polymeric substrates, for example, of polyimide, polyethylene terephtalate, polycarbonate, polyethene or polyvinyl chloride.

To apply the first electrode layer and the active layer from a solution, use can be made of any of the methods known, but preferably both layers are applied by spin coating. The layer thickness of the active layer often ranges between 10 and 250 nm and depends inter alia on the concentration of the polymer used in the solvent and on the number of revolutions during spin coating.

After drying, the active layer is provided with a second electroconductive layer which serves as the electrode layer for injecting electrons into the active layer. This electrode layer may be made from the above-mentioned materials, such as indium, calcium, barium or magnesium. This second layer can be provided by sputtering or vacuum evaporation. By providing the active layer with a mask during vacuum evaporation or sputtering, the electrode layer is provided with a structure. If reactive barium is used as the second electrode layer, said layer is preferably covered with a protective coating, for example, of an inert metal or epoxy, or both.

These and other aspects of the invention will be apparent from and elucidated with reference to the embodiments described hereinafter.

In the drawings

Figure 2:
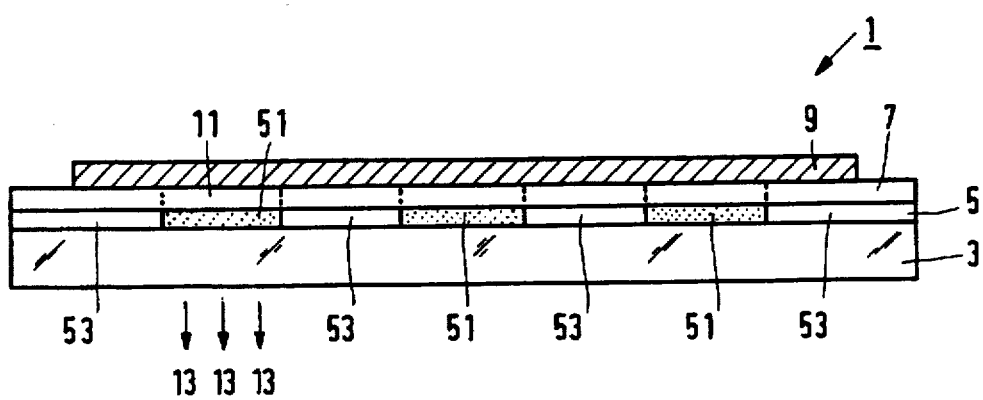
Figure 3:
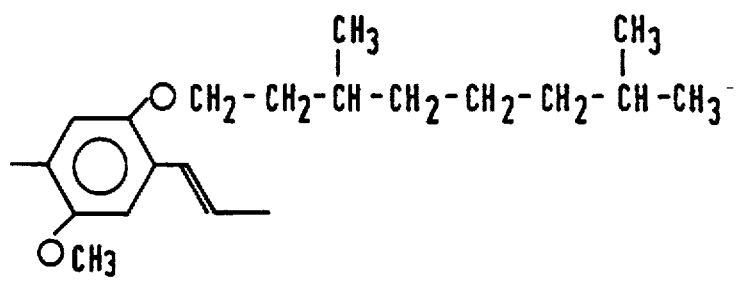
Figure 4:
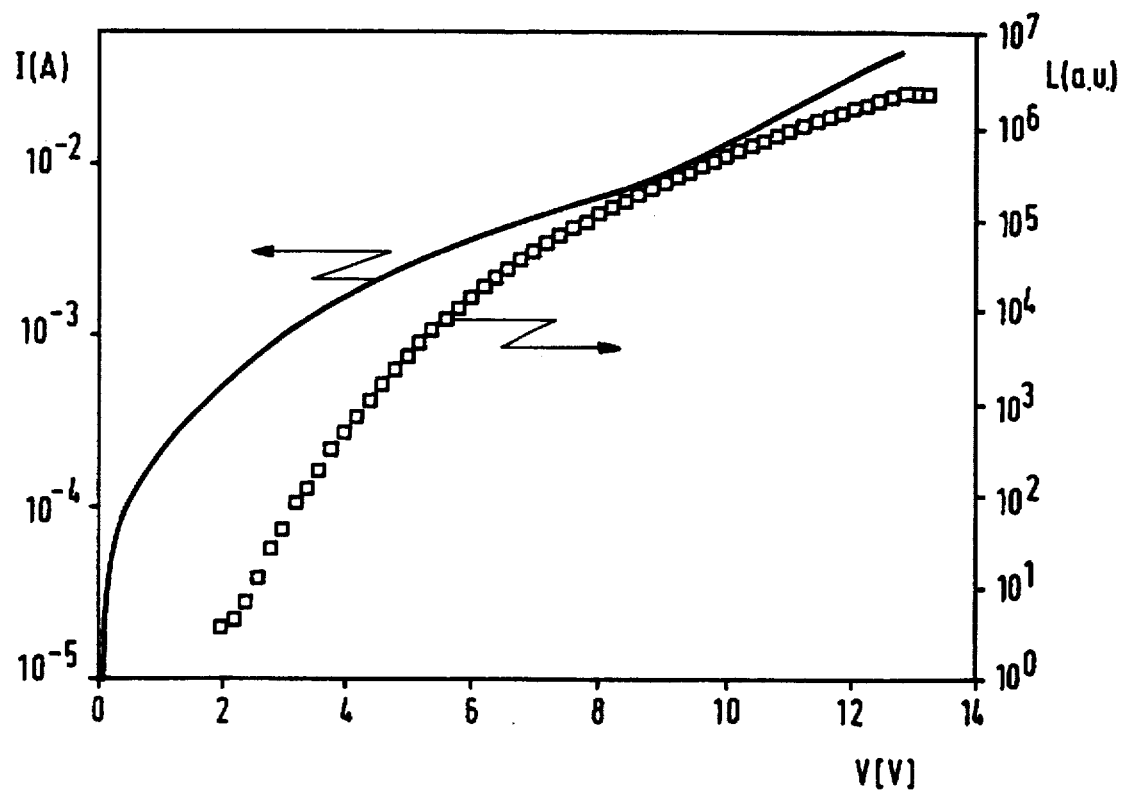

FIG. 1 schematically shows a plan view of an electroluminescent device in the form of a display, FIG. 2 schematically shows a cross-sectional view taken on the line II—II in FIG. 1, FIG. 3 shows the structural formula of a repeating unit of conjugated poly[2-methoxy,5-(3,7-dimethyloctyloxy)-p-phenylene vinylene], and FIG. 4 shows a I-V and L-V characteristic of an LED in accordance with the invention.

EXEMPLARY EMBODIMENT 1

Preparation of a coating solution of electroconductive polyaniline (PANI)

Conductive polyaniline is prepared by adding an aqueous solution of $(NH_4)_2S_2O_8$ to a hydrochloric solution of aniline. The precipitated polyaniline is filtered off and washed with water. This synthesis is described in an article by Y. Cao et al., Polymer 30, 2305–2311 (1989). A quantity of 2g of the coating solution is prepared, which is composed of 0.5 wt. % conductive polyaniline in m-cresol. A quantity of 0.15 g 1-benzoyl-1-cyclohexanol is added as a photochemical radical-forming agent to this solution.

Manufacture of polymeric LEDs for a display

In FIG. 1, reference numeral 1 refers to a schematic plan view of the structure of a polymeric electroluminescent device in the form of a display. FIG. 2 is a schematic cross-sectional view taken on the line II—II in FIG. 1. A 100 μm thick substrate 3 of polyethylene terephtalate is provided with a layer of electroconductive PANI by spin coating of the above-mentioned solution. The layer is dried for 1 minute at 90° C., thereby forming an electrode layer 5 of PANI having a thickness of 200 nm. Subsequently, the electrode layer 5 is exposed to patterned radiation with deep UV light (wavelength <320 nm) originating from a Hg lamp via a mask in a nitrogen atmosphere. The unexposed areas 51 of the electrode layer 5 have a square resistance of 1 kΩ/square (calculated specific conductivity 50 S/cm), whereas the exposed areas 53 have a square resistance above $10^{10}$ Ω/square. Both the conductive and non-conductive PANI are transparent to visible light. The in-situ doped conductive PANI is surrounded by areas 53 of non-conductive PANI, so that further planarization steps can be dispensed with.

The electroconductive areas 51 in the electrode layer 5 serve as electrodes for injecting holes into the active layer 7, which is to be provided in a subsequent step and which is made from conjugated PPV with a repeating unit in accordance with FIG. 3 (poly[2-methoxy, 5-(3,7-dimethyloctyloxy)-p-phenylene vinylene]). The preparation of a similar PPV, namely MEH-PPV, is described in the international Patent Application WO 92/16023. The preparation of PPV in accordance with FIG. 3 is effected in the same manner as in the known method by using 4-methoxyphenol and 1-bromo-3,7-dimethyloctane as the starting materials. The active layer 7 having a thickness of 150 nm is manufactured by spin coating of an 1–3 wt. % solution of the conjugated 2,5-dialkoxy-substituted PPV. For the solvent, use can be made of toluene, xylene, THF or mixtures thereof. Calcium electrodes 9 are vacuum evaporated via a mask on the active layer 7 at a pressure below $2.10^{-4}$ Pa. The calcium electrodes 9 have a layer thickness of 250 nm and serve to inject electrons into the active layer 7. The calcium electrodes 9 intersect the polymeric electrodes 51 at right angles. The overlapping rectangular areas of both types of electrodes form the nine LEDs or pixels of the display, one of said LEDs or pixels being referenced 11 in FIG. 1 and 2. In FIG. 1 only three electrodes of each type are shown. It is obvious that this number can be expanded to increase the number of pixels. The dimensions of the polymeric electroluminescent device 1 are 5×5 cm.

By way of example, one of the calcium electrodes 9 (the middle electrode of FIG. 1) and one of the polymeric electrodes 51 (the leftmost electrode of FIG. 1) are connected to a DC source, the calcium electrodes 9 being earthed. The active layer 7 of conjugated PPV emits, at the location of pixel 11, homogeneous orange light which leaves the LED via the substrate 3 (indicated by arrows 13). Said light has a brightness of 1000 Cd/m$^2$, so that it is also clearly visible under daylight conditions. In this manner, a light-emitting pixel 11 is formed. The other pixels emit light if the relevant intersecting electrodes are driven by the voltage source. The efficiency is 0.3%, i.e. three photons are generated per 1000 electrons injected into the active layer.

EXEMPLARY EMBODIMENT 2

A quantity of 0.35 mmol 3,4-ethylene dioxythiophene (EDOT, supplier bayer AG) is mixed with a solution of 0.81 mmol tris(toluene sulphonate)Fe(III)and 0.25 mmol imidazole in 1.5 g 1-butanol. The solution obtained is passed through a filter having a mesh size of 0.5 μm. The solution is stable at room temperature for at least 12 hours.

This solution is spin coated as a layer onto the substrate 3. The layer obtained is dried at 50° C. for 3 minutes. In accordance with exemplary embodiment 1, the layer is exposed to patterned radiation with UV light (λ<300 nm) by means of an Hg lamp, so that the areas 51 remain unexposed. Subsequently, the layer is heated to 110° C. for 1 minute. After cooling of the layer, the Fe(II) salt formed is extracted from the layer by means of 1-butanol. After extraction, the average layer thickness of the electrode layer 5 is 140 nm. The unexposed areas 51 of the electrode layer 5 comprise electroconductive poly-3,4-ethylene dioxythiophene (PEDOT) having a square resistance of 240 Ω/square, from which the specific conductivity can be calculated to be 300 S/cm. The exposed parts 53 of the electrode layer 5 comprise a non-conductive polymer having a square resistance of $0.7 \cdot 10^9$ Ω/square. The electroconductive areas 51 in the electrode layer 5 serve as electrodes for injecting holes into the active layer 7 of poly[2-methoxy,5-(3,7-dimethyloctyloxy)-p-phenylene vinylene] (repeating unit in accordance with FIG. 3).

Both the conductive and non-conductive PEDOT are transparent to visible light. Conductive areas 51 of PEDOT are surrounded by areas 53 of insulating PEDOT, so that further planarization steps can be dispensed with.

The further construction of the polymeric electroluminescent device as well as its properties are the same as in exemplary embodiment 1.

FIG. 4 shows the characteristic of the LED obtained, the current I in ampère being logarithmically plotted as a function of the applied voltage V in volts between the electrodes. Said Figure also shows the quantity of light L (electroluminescence) in arbitrary units (a.u.) as a function of the voltage V. The LED emits orange light in the range between 550 and 700 nm, with a maximum around 610 nm.

The method in accordance with the invention enables a polymeric LED having a large surface area to be manufactured in a simple manner by means of spin coating, the electrode layer being formed from conductive polymer. The electrode layer is structured into electrodes by patterned irradiation, thereby forming pixels for a display. When a flexible substrate surface is used, the LED in accordance with the invention can be easily bent, without causing damage to the electrodes.

We claim:

1. An electroluminescent device comprising an active layer made from a semiconductive conjugated polymer, which layer is situated between a first and a second electrode layer of which at least the first electrode layer is transparent to the light to be emitted and comprises an electroconductive polymer which is suitable for injecting holes into the active layer, characterized in that also patterned areas of an electrically insulating polymer are provided in the transparent (or first) electrode layer.

2. An electroluminescent device as claimed in claim 1, characterized in that the first electrode layer comprises polyaniline.

3. An electroluminescent device as claimed in claim 1, characterized in that the first electrode layer comprises poly-3,4-ethylene dioxythiophene.

4. An electroluminescent device as claimed in claim 1, characterized in that the active layer comprises conjugated 2,5-substituted poly(p-phenylene vinylene).

5. An electroluminescent device as claimed in claim 4, characterized in that the active layer comprises poly[2-methoxy,5-(3,7-dimethyloctyloxy)-p-phenylene vinylene].

6. An electroluminescent device comprising a first electrode layer and a second electrode layer, an active layer comprising a semiconductor conjugated polymer situated between said first and second electrode layers, said first electrode layer being transparent to the light to be emitted and comprising an electroconductive polymer suitable for injecting holes into the active layer, characterized in that said first electrode layer is structured into electroconductive areas and electrically insulating areas.

7. The electroluminescent device of claim 6, characterized in that said second electrode layer is formed of a material suitable for injecting electrons into the active layer.

8. The electroluminescent device of claim 7, characterized in that said second electrode layer is transparent to the light to be emitted.

9. An electroluminescent device comprising an active layer made from a semiconducting conjugated polymer, which layer is situated between a first and a second electrode layer of which at least the first electrode is transparent to the light to be emitted and comprises an electroconductive polymer which is suitable for injecting holes into the active layer, characterized in that the electroconductive polymer is poly-3,4-ethylenedioxythiophene, further characterized in that the first electrode layer is structured into electroconductive areas and electrically insulating areas.

* * * * *